United States Patent
Tews

(10) Patent No.: US 11,953,534 B2
(45) Date of Patent: Apr. 9, 2024

(54) DETECTION OF LIGHTNING AND RELATED CONTROL STRATEGIES IN ELECTRIC POWER SYSTEMS

(71) Applicant: Schweitzer Engineering Laboratories, Inc., Pullman, WA (US)

(72) Inventor: Cody W. Tews, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 261 days.

(21) Appl. No.: 17/242,449

(22) Filed: Apr. 28, 2021

(65) Prior Publication Data

US 2022/0349929 A1 Nov. 3, 2022

(51) Int. Cl.
| | | |
|---|---|---|
| G01R 29/08 | (2006.01) | |
| G01R 31/08 | (2020.01) | |
| G01R 31/58 | (2020.01) | |
| H02H 1/00 | (2006.01) | |
| H02H 7/26 | (2006.01) | |

(52) U.S. Cl.
CPC ....... *G01R 29/0842* (2013.01); *G01R 29/085* (2013.01); *G01R 31/08* (2013.01); *G01R 31/086* (2013.01); *G01R 31/58* (2020.01); *H02H 1/0007* (2013.01); *H02H 7/26* (2013.01)

(58) Field of Classification Search
None
See application file for complete search history.

(56) References Cited

U.S. PATENT DOCUMENTS

| 5,771,020 A | * | 6/1998 | Markson | ................... G01S 5/06 73/170.24 |
| 6,717,089 B1 | * | 4/2004 | Azzola | ................. H01H 71/504 335/147 |
| 2011/0046809 A1 | * | 2/2011 | Fickey | ................... H02H 5/005 702/3 |

(Continued)

OTHER PUBLICATIONS

T. B. Mcdonald III, M. A. Uman, J. A. Tiller, and W. H. Beasley (Lightning Location and Lower-Ionospheric Height Determination From Two-Station Magnetic Field Measurements, 1979) (Year: 1979).*

(Continued)

*Primary Examiner* — Nasima Monsur
*Assistant Examiner* — Joseph O Nyamogo
(74) *Attorney, Agent, or Firm* — Jared L. Cherry

(57) ABSTRACT

The present disclosure pertains to systems and methods for detecting lightning and using such information to implement appropriate control strategies in an electric power system. In one embodiment, a system may include a data acquisition subsystem configured to receive a plurality of representations of electrical conditions associated with at least a portion of the electric power system. The system may also include a traveling wave subsystem to identify an initial traveling wave in the electric power system and generated by lightning and identify at least one subsequent traveling wave in the electric power system and generated by lightning. A lightning analysis subsystem may perform an analysis of the initial traveling wave and the at least one subsequent traveling wave to determine a characteristic of the ionosphere based on the analysis and a lightning location. An adaptive control subsystem may adjust a control strategy based on the lightning location.

19 Claims, 5 Drawing Sheets

(56) References Cited

U.S. PATENT DOCUMENTS

| | | | |
|---|---|---|---|
| 2011/0077866 A1* | 3/2011 | Woo | H02H 3/40 702/59 |
| 2016/0241336 A1* | 8/2016 | Kasztenny | H04B 10/0791 |
| 2018/0196163 A1* | 7/2018 | Desmond | G01R 33/10 |

OTHER PUBLICATIONS

T. Mcdonald, M. Uman, J. Tiller and W. Beasley, "Lightning Location and Lower-Ionospheric Height Determination From Two-Station Magnetic Field Measurements," Journal of Geophysical Research, vol. 84, No. C4, pp. 1727-1734, 1979.

Marcos Rubinstein and Martin A. Uman, "Methods for calculating the electromagnetic fields from a known source distribution: application to lightning," IEEE Transactions on Electromagnetic Compatibility, vol. 31, No. 2, pp. 183-189, 1989.

A. Leal, B. Rocha and V. Rakov, "Estimation of ionospheric reflection heights using CG and IC lightning electric field waveforms," in 2017 International Symposium on Lightning Protection (XIV SIPDA), Natal, Brazil. Oct. 2017.

A. Leal, V. Rakov and B. Rocha, "Classification of CIDs observed in Florida using the lightning detection and waveform storage system(LDWSS)," in 2017 International Symposium on Lightning Protection (XIV SIPDA), Natal, 2017.

Edmund O. Schweitzer III, Veselin Skendzic, Armando Guzman, Mangapathirao Venkata Mynam, and Jean Leon Eternod, "Mystery Solved: Five Surprises Discovered With Megahertz Sampling and Traveling-Wave Data Analysis" Schweitzer Engineering Laboratories, Inc. Mar. 2019.

V.A. Rafalsky, A.P. Nickolaenko, A.V. Shvets, and M. Hayakawa, "Location of Lightning Discharges from a Single Station" Journal of Geophysical Research, vol. 100, No. D10, pp. 20,829-20,838. Oct. 20, 1995.

Vijaya B. Somu, Vladimir A. Rakov, Michael A. Haddad, and Steven A. Cummer, "A Study of Changes in Apparent Ionospheric Reflection Height Within Individual Lightning Flashes" Journal of Atmospheric and Solar-Terrestrial Physics 135, Sep. 2015.

V. Ramachandran, J. N. Prakash, A. Deo, S. Kumar "Lightning stroke distance estimation from single station observation and validation with WWLLN data" Annales Geophysicae, European Geosciences Union, 25 (7), pp. 1509-1517. Jul. 2007.

* cited by examiner

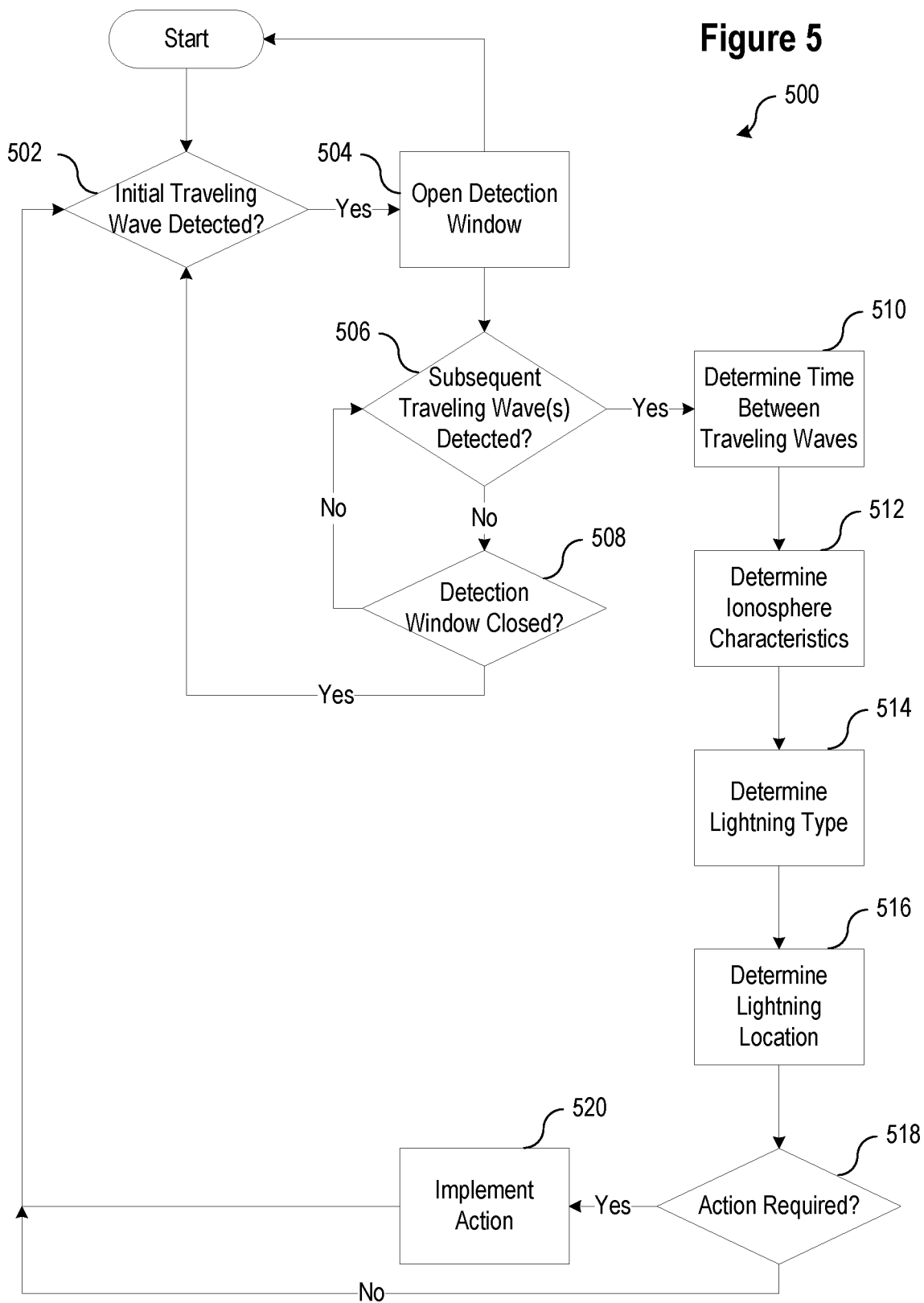

DETECTION OF LIGHTNING AND RELATED CONTROL STRATEGIES IN ELECTRIC POWER SYSTEMS

TECHNICAL FIELD

The present disclosure pertains to systems and methods for detecting lightning and using such information to implement appropriate control strategies in an electric power system.

BRIEF DESCRIPTION OF THE DRAWINGS

Non-limiting and non-exhaustive embodiments of the disclosure are described, including various embodiments of the disclosure, with reference to the figures, in which:

FIG. 5 illustrates a flow chart of a method to detect lightning by identifying and analyzing traveling waves and to implement adaptive control strategies consistent with embodiments of the present disclosure.

DETAILED DESCRIPTION

Figure 1A:
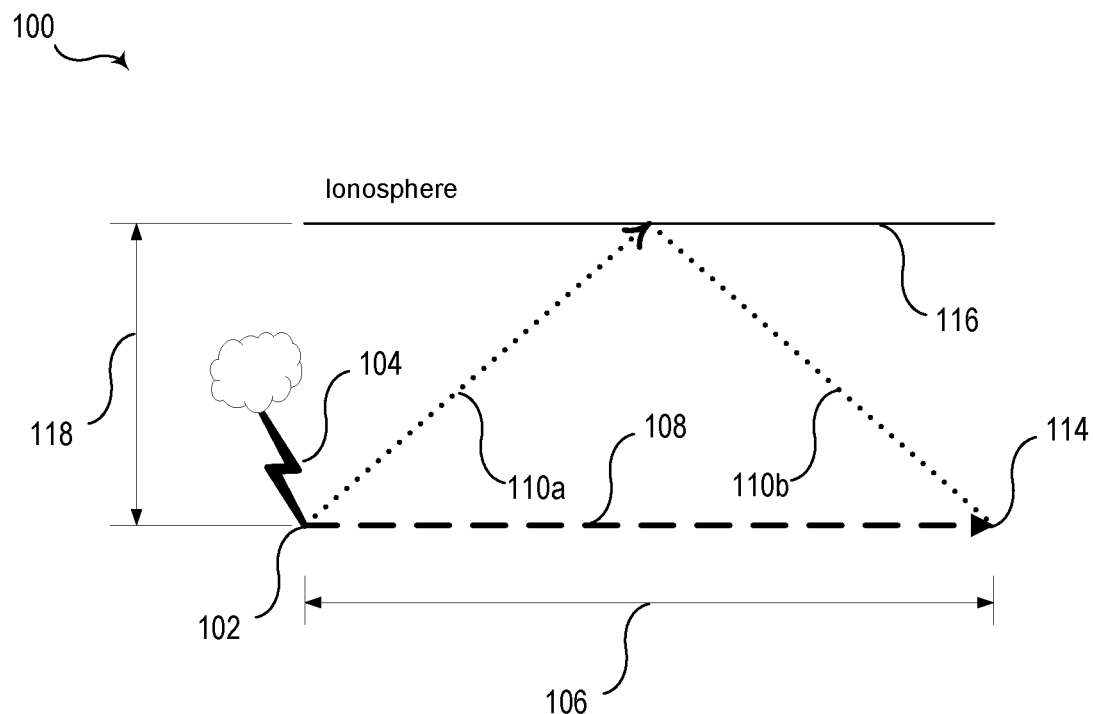
FIG. 1A illustrates a conceptual representation of a cloud-to-ground-lightning strike along with a ground wave and skywave that may be detected by an electric power system consistent with embodiments of the present disclosure.

Electrical power systems are required to operate in a variety of conditions and while exposed to potential damage from weather and other elements. The weather can have a significant impact on the operation of electric power systems and the techniques used to control such systems.

In various embodiments consistent with the present disclosure, systems may detect lightning and adjust control strategies in response to lightning. Lightning may couple to conductors in electric power systems and create traveling waves that may be detected by high-speed monitoring systems associated with such electrical conductors. Traveling waves are transient signals that propagate at nearly the speed of light, and as such, high-speed monitoring is necessary to detect and analyze traveling waves. In some embodiments, high-speed detection systems may generate one million samples per second or more of electrical parameters (e.g., voltage).

Information related to lightning may be used to adjust the control strategies used in connection with the electric power system. Various embodiments consistent with the present disclosure may provide a variety of types of information (e.g., the type of lightning, the location of the lightning, the rate of lightning, etc.) that may be used to adjust control strategies used in an electric power system. For example, during lightning storms, certain control strategies (e.g., automatic reclosure following trips) may be retrained to reduce the risk of fire. Further, such information may be used to change relay settings or group settings, change wide-area remedial action scheme (RAS) behavior, and inform system operators of potential issues.

If a power system operator (or RAS) has real-time knowledge of a likelihood of specific assets having a decreased reliability due to lightning, they can take proactive measures. Such measures may include bringing online redundant capacity/lines, postponing outages, coordinating with neighboring utilities, and the like. A lightning strike may trigger a protective relay (removing equipment from service due to over-voltage conditions), or cause damage to power system equipment, which would then be mitigated by a protective relay. In either scenario, the removal of service of a power system device, can cause weakness in overall stability of a power system. Using time and location information of an evolving lightning storm, the operator of a power system may respond appropriately.

In addition to using information related to lightning for control of an electric power system, such information may also provide valuable information about weather conditions and the ionosphere. Information about lightning is typically obtained using specialized sensors. Such sensors are both expensive and limited in area, where electric power systems are widely distributed and systems and methods consistent with the present disclosure may be retrofitted into an existing electrical power system. As such, information may be gathered from large areas using existing infrastructure. Such information may be useful for weather and atmospheric prediction, modeling, and research.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once unless otherwise specified.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc. that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or another electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor-executable instructions.

FIG. 1A illustrates a conceptual representation 100 of a cloud-to-ground ("CG") lightning strike 104 along with a groundwave 108 and skywave 110a, 110b that may be detected by an electric power system consistent with embodiments of the present disclosure. CG lightning 104 strikes the ground at point 102 at time $t_0$ and launches a groundwave 108. The groundwave 108 propagates a distance 106 before being detected by a receiver 114 located at a distance, r, from the point 102 at which the CG lightning strike 104 occurred.

The CG lightning strike 104 also launches a skywave 110a that reflects 110b off of the ionosphere 116 before being detected by receiver 114. The additional distance traveled by the skywave 110 in comparison to the groundwave 108 results in a temporal delay, $t_1$, between when the groundwave 108 and the skywave 110. The height 118 of the ionosphere 116, $H_p$, may be determined using the temporal delay, $t_1$, the distance, r, and the speed of light, c, as shown in Eq. 1.

$$H_p = \frac{\sqrt{(ct_1)^2 + 2 \cdot ct_1 r}}{2} \quad \text{Eq. 1}$$

Various embodiments may use different techniques to determine the height 118 of the ionosphere 116, $H_p$, and the distance, r. In some embodiments, multiple measurement locations may be used, and the height 118 of the ionosphere 116, $H_p$, may be considered a constant across the measurements. As such, one variable may be eliminated and a values for both the height 118 of the ionosphere 116, $H_p$, and the distance, r, may be determined. Further, in some embodiments, multiple lightning strikes may be analyzed over a span of time. The height 118 of the ionosphere 116, $H_p$, may be considered a constant across measurements relatively close in time. This strategy again allows for one variable to be eliminated and for values of both the height 118 of the ionosphere 116, $H_p$, and the distance, r, to be determine. In yet other embodiments, a system of equations may be determined and solved using multiple lighting strikes, spectral attenuation may be used to estimate a distance the distance, r, and/or vector direction finding may be used.

In various embodiments of the present disclosure, an electric power system may act as the receiver 114. CG lightning strike 104 induces a transient signal in transmission and/or distribution lines of the electric power system that may be detected using a high-speed (e.g., one million samples per second) monitoring system. One specific embodiment comprises the SEL-T400L Time-Domain Line Production relay available from Schweitzer Engineering Laboratories of Pullman, Washington, which samples electric parameters at a rate of one million samples per second. Groundwave 108 and skywave 110 create a high-speed transient signal that may each be detected and used in Eq. 1 to calculate the height 118 of the ionosphere 116.

Detection of lightning in proximity to an electric power system may be used to adjust control strategies. For example, various responses of the system may be made more sensitive to potential lightning strikes or made more robust. Further, strategies could be implemented to mitigate against the potential for fire caused by equipment in the electric power system (e.g., blocking recloser algorithms).

Figure 1B:
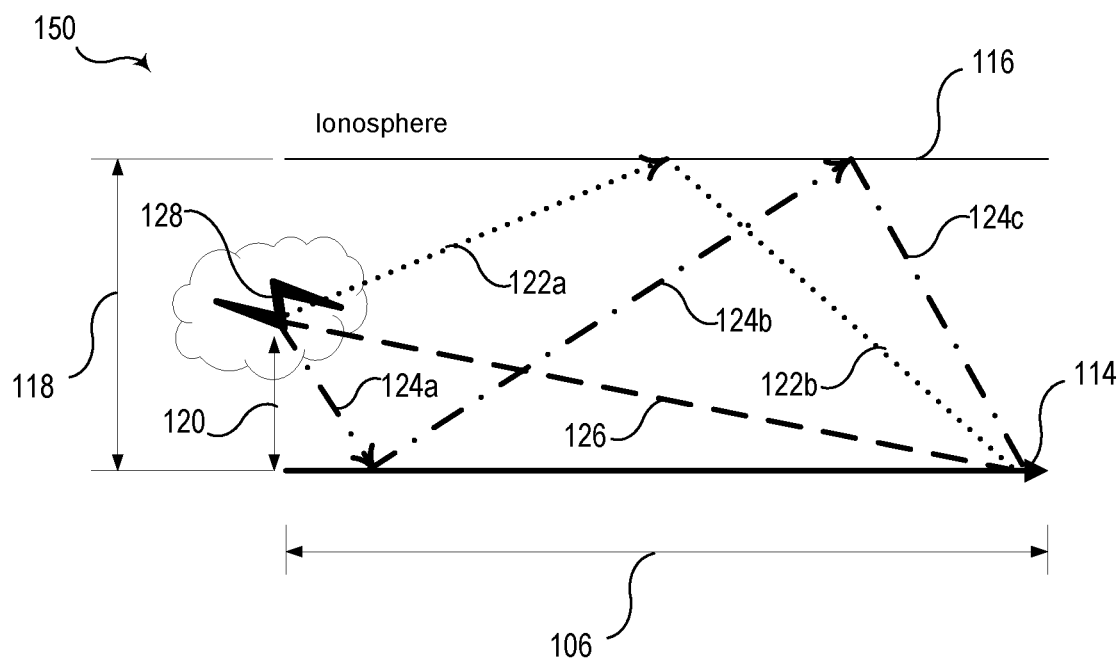
FIG. 1B illustrates a conceptual representation of a compact intracloud discharge (CID) along with two skywaves that may be detected by an electric power system consistent with embodiments of the present disclosure.

FIG. 1B illustrates a conceptual representation of a compact intracloud discharge (CID) 128 along with skywaves 122, 124, and 126 that may be detected by an electric power system consistent with embodiments of the present disclosure. The CID 128 occurs at $t_0$ and at a distance 106 from receiver 114. Skywave 126 follows a direct path from CID 128, and thus arrives at receiver 114 at $t_1$ before skywaves 122 and 124, both of which must reflect before arriving at receiver 114. Skywave 122a travels from CID 128 and reflects off ionosphere 116. Skywave 122b travels from the point of reflection off the ionosphere 116 before reaching receiver 114 at $t_2$. Skywave 124a travels from CID 128 and reflects off of the ground. The reflection, skywave 124b, reflects again off the ionosphere 116, creating skywave 124c, which is detected by receiver 114 at $t_3$.

As described below, the times of arrival of each skywave (i.e., $t_1$, $t_2$, and $t_3$) may be analyzed to determine the height 120 of CID 128, the height 118 of the ionosphere 116, and the distance 106 between the CID 128 and the receiver 114. Further, detection of three skywaves (as opposed to detection of a groundwave and a skywave) differentiates CID lightning from CG lightning. All of this information may be used by an electric power system to adjust a control strategy.

Figure 2A:
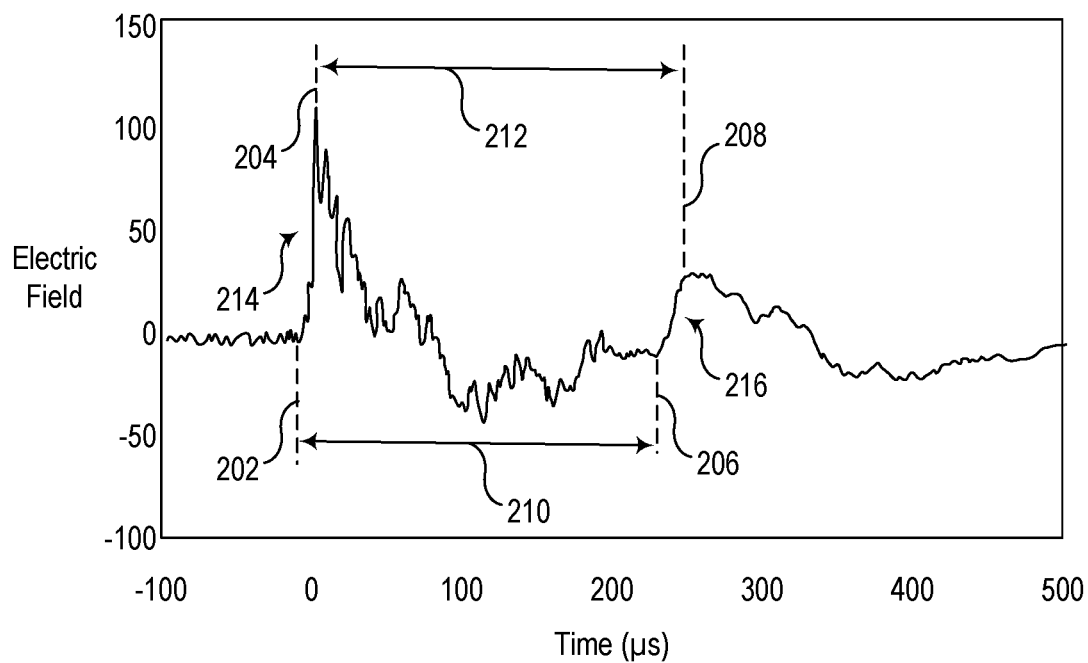
FIG. 2A illustrates a plot over time of an electric field measured at a receiver and generated from a CG lightning strike consistent with embodiments of the present disclosure.

FIG. 2A illustrates a plot over time of an electric field measured at a receiver and generated from a CG lightning strike consistent with embodiments of the present disclosure. The CG lightning strike creates a first traveling wave 214 corresponding to a groundwave and a second traveling wave corresponding to a skywave 216. The time between the arrival of the first traveling wave 214 and the second traveling wave 216 may be used with Eq. 1 to determine the height of the ionosphere. Other parameters, such as a distance between the CG lightning strike and a receiver may also be determined.

The time between the arrival of the first traveling wave 214 and the second traveling wave 216 may be determined using various schemes. For example, one scheme may detect a time delay 210 between the start of the ramp (i.e., points 202 and 206) of each traveling wave 214, 216. Another scheme may detect a time delay 212 between a peak value 204 of the first traveling wave 214 and a peak value 208 of the second traveling wave 216.

Figure 2B:
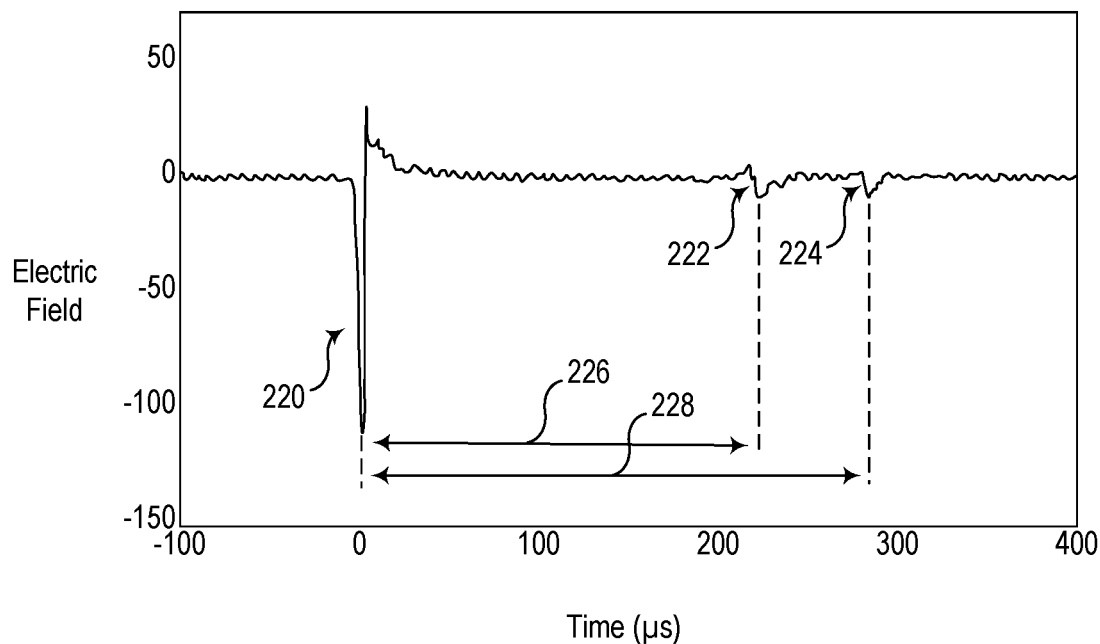
FIG. 2B illustrates a plot over time of an electric field measured at a receiver and generated from CID lightning consistent with embodiments of the present disclosure.

FIG. 2B illustrates a plot over time of an electric field measured at a receiver and generated from CID lightning consistent with embodiments of the present disclosure. A first traveling wave 220 may be generated by a skywave that follows a direct path from the CID to a receiver. A second traveling wave 222 may be generated by a skywave that reflects off the ionosphere before being detected by the receiver. A third traveling wave 224 may be generated by a skywave that first reflects off the ground, then reflects off the ionosphere before being detected by the receiver. Using information about the time 226 between the first skywave 220 and the second skywave 222, along with the time 228 between the first skywave 220 and the third skywave 224, a system may estimate both the height of the CID lightning and the ionosphere.

In connection with both FIG. 2A and FIG. 2B, a skywave detection subsystem and/or a groundwave detection subsystem may detect an initial traveling wave and subsequent traveling waves. In various embodiments, detection of an initial traveling wave may open a detection window for identification of a subsequent traveling wave. The length of the window may be determined by the length of the transmission line associated with the first traveling wave. If a subsequent traveling wave is not detected within the window, the window may close. Closure of the window without detection of a subsequent traveling wave may be an indication that the initial traveling wave was caused by a phenomena other than lightning.

Figure 3:
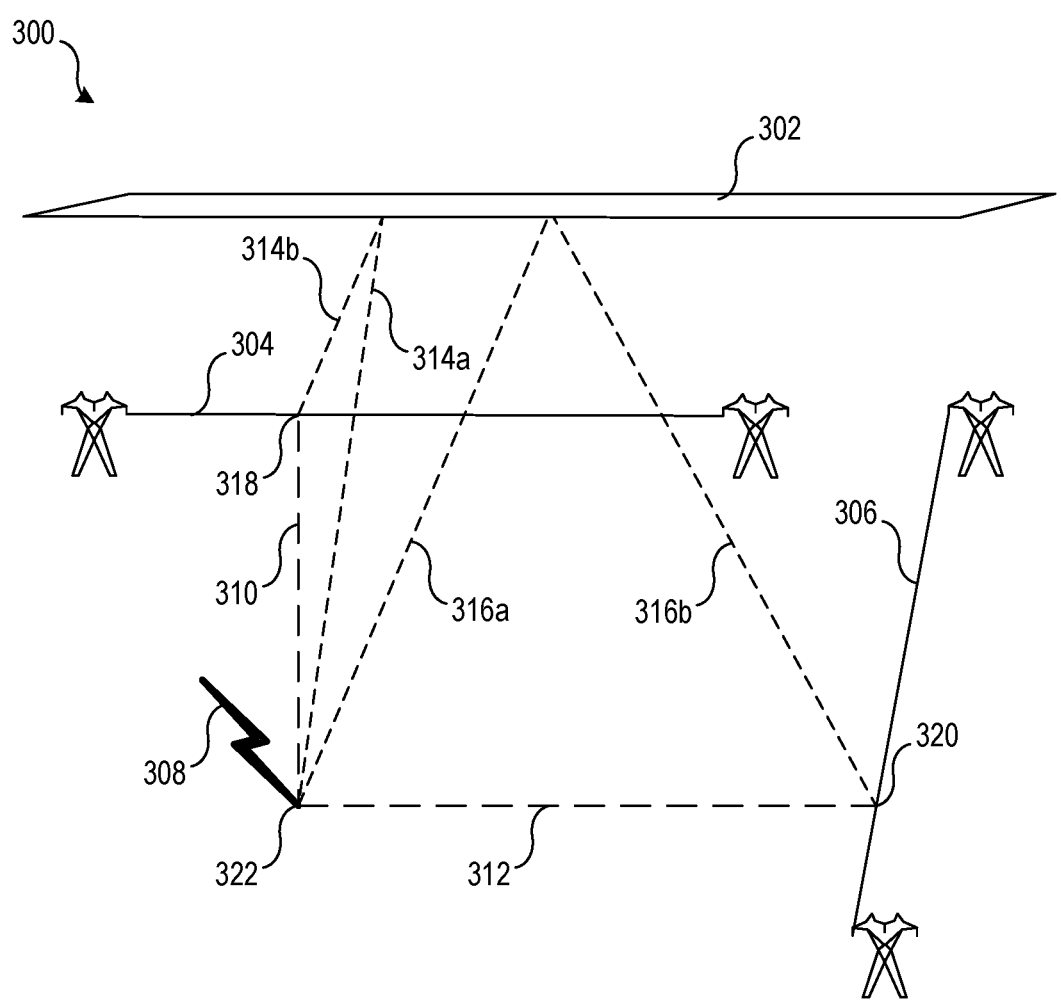
FIG. 3 illustrates a conceptual planar diagram of a system to determine a location of a lightning strike consistent with embodiments of the present disclosure.

FIG. 3 illustrates a conceptual planar diagram of a system 300 to determine a location 322 of a lightning strike 308 consistent with embodiments of the present disclosure. System 300 includes two transmission lines 304 and 306. Lightning strike 308 strikes at location 322 and generates ground waves 310 and 312, which propagate toward transmission lines 304 and 306, respectively. Lightning strike 308 also launches skywaves 314 and 316. Skywaves 314a and 316a travel from lightning strike 308 toward ionosphere 302. Reflections of skywaves 314b and 316b reflect off of ionosphere 302 and back toward transmission lines 304 and 306, respectively.

Ground waves 310 and 312 and skywaves 314 and 316 may be detected by high-speed monitoring systems associated with transmission lines 304 and 306. Using the techniques described above, system 300 may identify locations 318 and 320 along transmission lines 304 and 306, respectively, at which the lightning strike 308 occurred. The peaks of waves 314 and 316 correspond to the shortest path to transmission lines 304 and 306. Using the locations 318 and 320, system 300 may determine the location 322 of the lightning strike 308.

Figure 4:
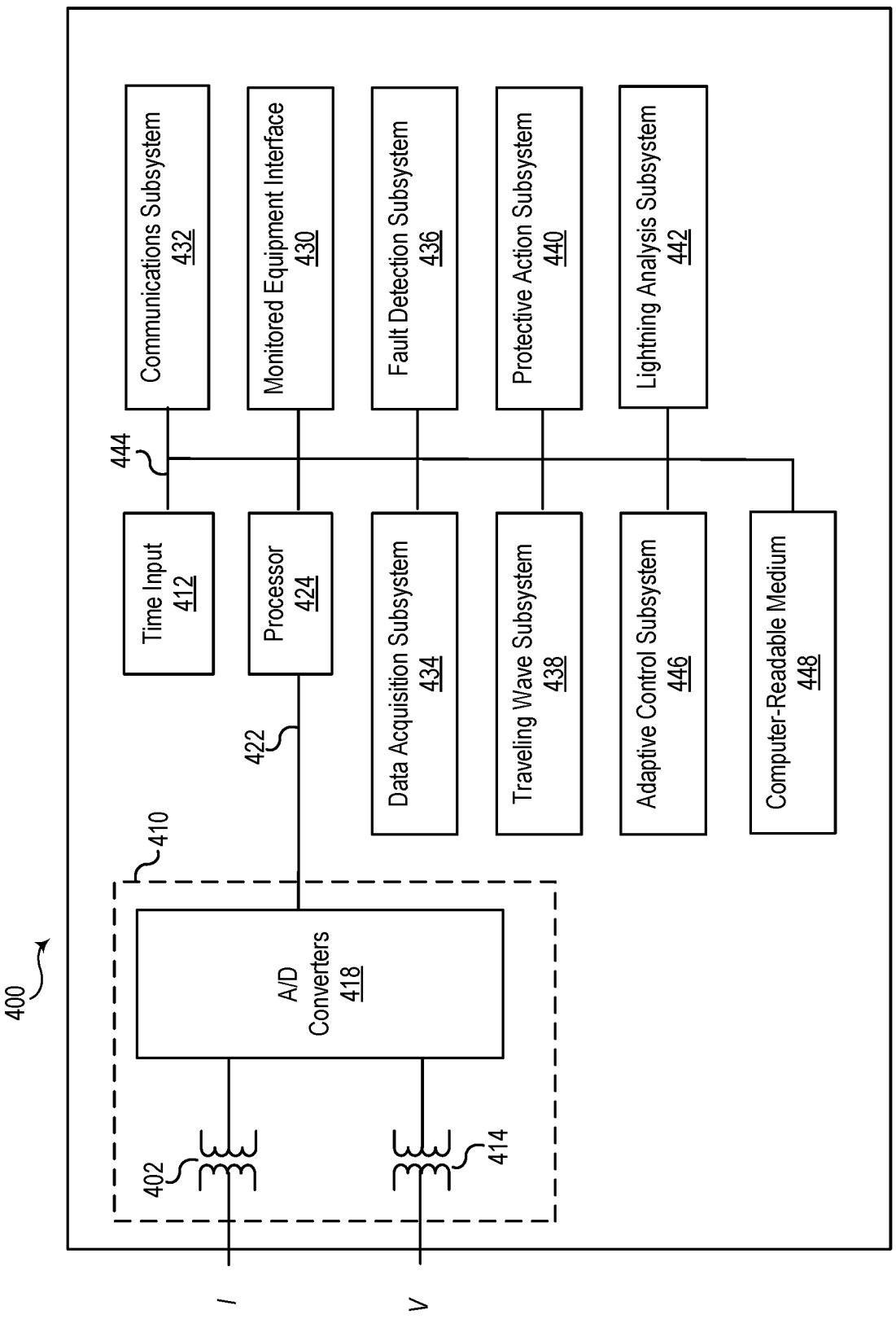
FIG. 4 illustrates a functional block diagram of a system to detect lightning by identifying and analyzing traveling waves and to implement adaptive control strategies consistent with embodiments of the present disclosure.

FIG. 4 illustrates a functional block diagram of a system 400 to detect lightning by identifying and analyzing traveling waves and to implement adaptive control strategies consistent with embodiments of the present disclosure. System 400 may be implemented using hardware, software, firmware, and/or any combination thereof. In some embodiments, system 400 may be embodied as an IED, while in other embodiments, certain components or functions described herein may be associated with other devices or performed by other devices. The specifically illustrated configuration is merely representative of one embodiment consistent with the present disclosure.

System 400 includes a communications subsystem 432 to communicate with devices and/or IEDs. In certain embodiments, communications subsystem 432 may facilitate direct communication with other IEDs or communicate with systems over a communications network. Measurements relating to electrical conditions and other information used by system 400 may be transmitted via communications subsystem 432. Further, measurements and information created by system 400 may be transmitted via communications subsystem 432 to other components.

A monitored equipment interface 430 may receive status information from, and issue control instructions to, a piece of monitored equipment (e.g., a generator, transformer, circuit breaker, or the like). Monitored equipment interface 430 may implement control actions upon the detection of an over-excitation condition. Such instructions may include changing an excitation of a generator or a transformer or disconnecting a generator or a transformer.

Processor 424 processes communications received via communications subsystem 432, monitored equipment interface 430, and the other subsystems and components in system 400. Processor 424 may operate using any number of processing rates and architectures. Processor 424 may perform various algorithms and calculations described herein. Processor 424 may be embodied as a general-purpose integrated circuit, an application-specific integrated circuit, a field-programmable gate array, and/or any other suitable programmable logic device. Processor 424 may communicate with other elements in system 400 by way of bus 444.

Computer-readable medium 448 may comprise any of a variety of non-transitory computer-readable storage media. Computer-readable medium 448 may comprise executable instructions to perform processes described herein. Computer-readable medium 448 may comprise non-transitory machine-readable media such as, but is not limited to, hard drives, removable media, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. Such electronic instructions may be executed on processor 424.

A sensor subsystem 410 may receive current measurements (I) and/or voltage measurements (V). The sensor subsystem 410 may comprise A/D converters 418 that sample and/or digitize filtered waveforms to form corresponding digitized current and voltage signals provided to a data bus 422. A high-fidelity current transformer 402 and/or a high-fidelity voltage transformer 414 may include separate signals from each phase of a three-phase electric power system. A/D converters 418 may be connected to processor 424 by way of data bus 422, through which digitized representations of current and voltage signals may be transmitted to processor 424.

Although the illustrated embodiment encompasses sensor component 410, in other embodiments, representations of electrical conditions may be received through a variety of types of data acquisition interfaces. For example, digitized representations may be received via communications subsystem 432. In another example, monitored equipment interface 430 may be configured to receive high-speed representations of electrical conditions from another device. A variety of types of data acquisition systems may be used consistent with the present disclosure.

System 400 may further comprise a time input 412, which may be used to receive a time signal (e.g., a common time reference) allowing system 400 to apply a time-stamp to the acquired samples. In various embodiments, the common time reference may comprise a time signal derived from a GNSS. In certain embodiments, a common time reference may be received via communications subsystem 432, and accordingly, a separate time input 412 may not be required for time-stamping and/or synchronization operations. One such embodiment may employ the IEEE 1588 protocol.

Data acquisition subsystem 434 may collect data samples such as the current and voltage measurements. The data samples may be associated with a timestamp and made available for retrieval and/or transmission to a remote IED via communications subsystem 432. Data acquisition subsystem 434 may operate in conjunction with fault detection subsystem 436. Data acquisition subsystem 434 may control the recording of data used by the fault detection subsystem 436. According to one embodiment, data acquisition subsystem 434 may selectively store and retrieve data and may make the data available for further processing. Such processing may include processing by fault detection subsystem 436, which may be configured to determine the occurrence of a fault within an electric power distribution system.

Traveling wave subsystem 438 may operate in conjunction with data acquisition subsystem 434 to measure and record traveling waves in real-time since they are transient signals that dissipate rapidly in an electric power delivery system. Traveling waves may also be analyzed in conjunction with fault detection subsystem 436 to identify the occurrence of a fault and the location of the source of traveling waves. Traveling wave subsystem 438 may further determine whether a traveling wave was generated by lightning or other events in the electric power system, such as faults. Faults may launch traveling waves that may be analyzed by fault detection subsystem 436 and used to determine the location of a fault and other information (e.g., the type of fault).

A protective action subsystem 440 may implement a protective action based on the identification of a fault by fault detection subsystem 436. In various embodiments, a protective action may include tripping a breaker, selectively isolating a portion of the electric power system, etc. Protective action subsystem 440 may coordinate protective actions with other devices in communication with system 400.

A lightning analysis subsystem 442 may operate in conjunction with traveling wave subsystem 438 to identify and analyze groundwaves and skywaves caused by lightning. Among other things, lightning analysis subsystem 442 may determine times between groundwaves and skywaves and may use such information to calculate the height of the ionosphere and the height of CID lightning. Based on the analysis of the times between groundwaves and skywaves, lightning analysis subsystem 442 may identify a location of a lightning strike. In one specific embodiment, a location may be determined using the principles described in connection with FIG. 3.

An adaptive control subsystem 446 may adapt a control strategy implemented by system 400 based on detection of lightning. For example, various responses of the system 400 may be made more sensitive to potential lightning strikes or made more robust. Further, strategies could be implemented to mitigate against the potential for fire caused by equipment in the electric power system (e.g., blocking recloser algorithms).

FIG. 5 illustrates a flow chart of a method 500 to detect lightning by identifying and analyzing traveling waves and to implement adaptive control strategies consistent with embodiments of the present disclosure. At 502, a system implementing method 500 may determine whether an initial traveling wave has been detected. An initial traveling wave may represent a ground wave (e.g., groundwave 214 illustrated in FIG. 2A) or a skywave (e.g., skywave 220 illustrated in FIG. 2B). An initial wave may be detected by a groundwave and skywave analysis subsystem, such as lightning analysis subsystem 442 illustrated in FIG. 4). Method 500 may remain at 502 until an initial traveling wave is detected.

Upon detection of an initial traveling wave, a detection window may open at 504. The length of the detection window may be determined by the length of the transmission line associated with the initial traveling wave. At 506, a system implementing method 500 may determine whether one or more subsequent traveling waves are detected. The subsequent traveling waves may be ground waves or skywaves. At 508, a system implementing method 500 may determine whether the detection window has closed. Closure of the detection window without detection of a subsequent traveling wave may be an indication that the initial traveling wave was caused by a phenomena other than lightning.

If a subsequent traveling wave is detected at 506, a time between the traveling waves may be determined at 510. Where multiple subsequent traveling waves are detected, the time between the initial traveling wave and each subsequent traveling wave may be determined, as illustrated in FIG. 2B and described above.

At 512, 514, and 516, various types of information may be determined. At 512, the ionosphere characteristics may be determined using the time between traveling waves determined at 510. The ionosphere characteristics may include the height of the ionosphere at different locations. At 514, the type of lightning type may be determined. In various embodiments, CG and CID lightning may be identified. In one embodiment, a lightning analysis subsystem, such as lightning analysis subsystem 442 in FIG. 4, may determine the ionosphere characteristics and the type of lightning. At 516, the location of the lightning may be determined. In one embodiment, a location subsystem, may be used to determine the location of the lightning.

At 518, a system a system implementing method 500 may determine whether action is required. Various types of action may be implemented at 520. In one embodiment, the action may include adapting a control strategy. For example, various responses of the system may be made more sensitive to potential lightning strikes or made more robust. An adaptive control subsystem, such as adaptive control subsystem 446 in FIG. 4 may be used to modify a control strategy. Still further, a protective action subsystem, such as protective action subsystem 440 in FIG. 4, may implement protective actions based on lightning detection.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to detect lightning and to control at least a portion of an electric power system, the system comprising:

a data acquisition subsystem configured to receive a plurality of representations of electrical conditions associated with at least a portion of the electric power system;

a traveling wave subsystem to:

identify an initial traveling wave generated by lightning and traveling in an electrical conductor configured to provide electric power as part of the electric power;

open a detection window upon detection of the initial traveling wave;

monitor for at least one subsequent traveling wave during the detection window; and identify the at least one subsequent traveling wave generated by lightning and traveling in the electrical conductor configured to provide electric power as part of the electric power;

a lightning analysis subsystem to perform an analysis of the initial traveling wave and the at least one subsequent traveling wave and to determine:

an ionosphere characteristic based on the analysis; and a lightning location; and an adaptive control subsystem to adjust a control strategy based on the lightning location and during the detection window;

wherein, the adjusting of the control strategy comprises blocking an automatic reclosure algorithm following a trip, and the adjusting of the control strategy is retrained to reduce the risk of fire.

2. The system of claim 1, wherein the lightning analysis subsystem is further configured to determine a type of lightning based on the analysis of the initial traveling wave and the at least one subsequent traveling wave.

3. The system of claim 2, wherein the type of lightning comprises one of cloud-to-ground (CG) lightning and compact intracloud discharge (CID) lightning.

4. The system of claim 3, wherein the lightning analysis subsystem is further configured to determine a height of CID lightning.

5. The system of claim 1, wherein the data acquisition subsystem is configured to receive about one million representations of electrical conditions per second.

6. The system of claim 1, wherein the ionosphere characteristic comprises a height.

7. The system of claim 1, wherein the lightning analysis subsystem is configured to determine the lightning location based on information gathered from at least two transmission lines in the electric power system.

8. The system of claim 1, wherein the traveling wave subsystem is further configured to detect a plurality of traveling waves generated by a fault, and further comprises a protective action subsystem to implement a protective action in response to the fault.

9. The system of claim 1, wherein the energized electrical conductor comprises a transmission line.

10. The system of claim 1, wherein the energized electrical conductor comprises a distribution line.

11. A method of detecting lightning and controlling at least a portion of an electric power system, the method comprising:

receiving, using a data acquisition subsystem, a plurality of representations of electrical conditions associated with at least a portion of the electric power system;

identifying, using a traveling wave subsystem, an initial traveling wave generated by lightning and traveling in an electrical conductor configured to provide electric power as part of the electric power system;

opening, using the traveling wave subsystem, a detection window upon detection of the initial traveling wave;

monitoring, using the traveling wave subsystem, for at least one subsequent traveling wave during the detection window;

identifying, using the traveling wave subsystem, the at least one subsequent traveling wave generated by lightning and traveling in the electrical conductor configured to provide electric power as part of the electric power;

performing, using a lightning analysis subsystem, an analysis of the initial traveling wave and the at least one subsequent traveling wave to determine:

an ionosphere characteristic based on the analysis; and a lightning location; and adjusting, using an adaptive control subsystem, a control strategy based on the lightning location and during the detection window;

wherein, adjusting the control strategy comprises blocking an automatic reclosure algorithm following a trip to reduce the risk of fire.

12. The method of claim 11, further comprising determining, using the lightning analysis subsystem, a type of lightning based on the analysis of the initial traveling wave and the at least one subsequent traveling wave.

13. The method of claim 12, wherein the type of lightning comprises one of cloud-to-ground (CG) lightning and compact intracloud discharge (CID) lightning.

14. The method of claim 13, further comprising determining, using the lightning analysis subsystem, a height of CID lightning.

15. The method of claim 11, wherein the plurality of representations received by the data acquisition subsystem comprise about one million representations of electrical conditions per second.

16. The method of claim 11, wherein the ionosphere characteristic comprises a height.

17. The method of claim 11, further comprising opening, using the traveling wave subsystem, a detection window upon detection of the initial traveling wave and monitoring for the at least one subsequent traveling wave during the detection window.

18. The method of claim 11, further comprising gathering, using the lightning analysis subsystem, information from at least two transmission lines in the electric power system to determine the lightning location.

19. The method of claim 11, further comprising: detecting, using the traveling wave subsystem, a plurality of traveling waves generated by a fault; and implementing, using a protective action subsystem, a protective action in response to the fault.

* * * * *